US010935603B1

(12) United States Patent
Ghosal et al.

(10) Patent No.: US 10,935,603 B1
(45) Date of Patent: Mar. 2, 2021

(54) DATA CHANNEL OPTIMIZATION WITH SMART BLACK BOX ALGORITHMS

(71) Applicant: Seagate Technology LLC, Cupertino, CA (US)

(72) Inventors: Sayan Ghosal, Bloomington, MN (US); John Tantzen, Eagan, MN (US)

(73) Assignee: SEAGATE TECHNOLOGY LLC, Fremont, CA (US)

(*) Notice: Subject to any disclaimer, the term of this patent is extended or adjusted under 35 U.S.C. 154(b) by 0 days.

(21) Appl. No.: 16/534,753

(22) Filed: Aug. 7, 2019

(51) Int. Cl.
*G01R 31/319* (2006.01)
*G06N 20/00* (2019.01)
*G06F 11/07* (2006.01)
*G01R 31/317* (2006.01)

(52) U.S. Cl.
CPC . *G01R 31/31905* (2013.01); *G01R 31/31701* (2013.01); *G01R 31/31908* (2013.01); *G06F 11/076* (2013.01); *G06N 20/00* (2019.01)

(58) Field of Classification Search
CPC .............................................. G01R 31/31905
USPC .................................. 714/724, 728, 733, 725
See application file for complete search history.

(56) References Cited

U.S. PATENT DOCUMENTS

| 7,173,438 | B2 * | 2/2007 | Pooranakaran .... | G01R 27/2605 324/678 |
| 7,962,276 | B2 * | 6/2011 | Turner .................... | F01L 1/143 701/108 |
| 2008/0244327 | A1 * | 10/2008 | Coombes .............. | G06F 11/348 714/45 |

* cited by examiner

*Primary Examiner* — Fritz Alphonse
(74) *Attorney, Agent, or Firm* — Westman, Champlin & Koehler, P.A.

(57) ABSTRACT

A system includes a host configured to communicate with a device under test. The host is configured to write test data to the device under test. An optimization engine is configured to optimize a plurality of parameters associated with a magnetic recording channel associated with the device under test. The optimization engine is configured to select a first set of parameters for the plurality of parameters and the host is configured to set the magnetic recording channel based on the first set of parameters. The host then measures the performance of the magnetic recording channel based on the first set of parameters. Based on the measured performance, the optimization engine then selects new parameter values for the plurality of parameters. Until the measured performance is within an acceptable threshold, the optimization engine will iteratively update the plurality of parameters based on the measured performance.

19 Claims, 10 Drawing Sheets

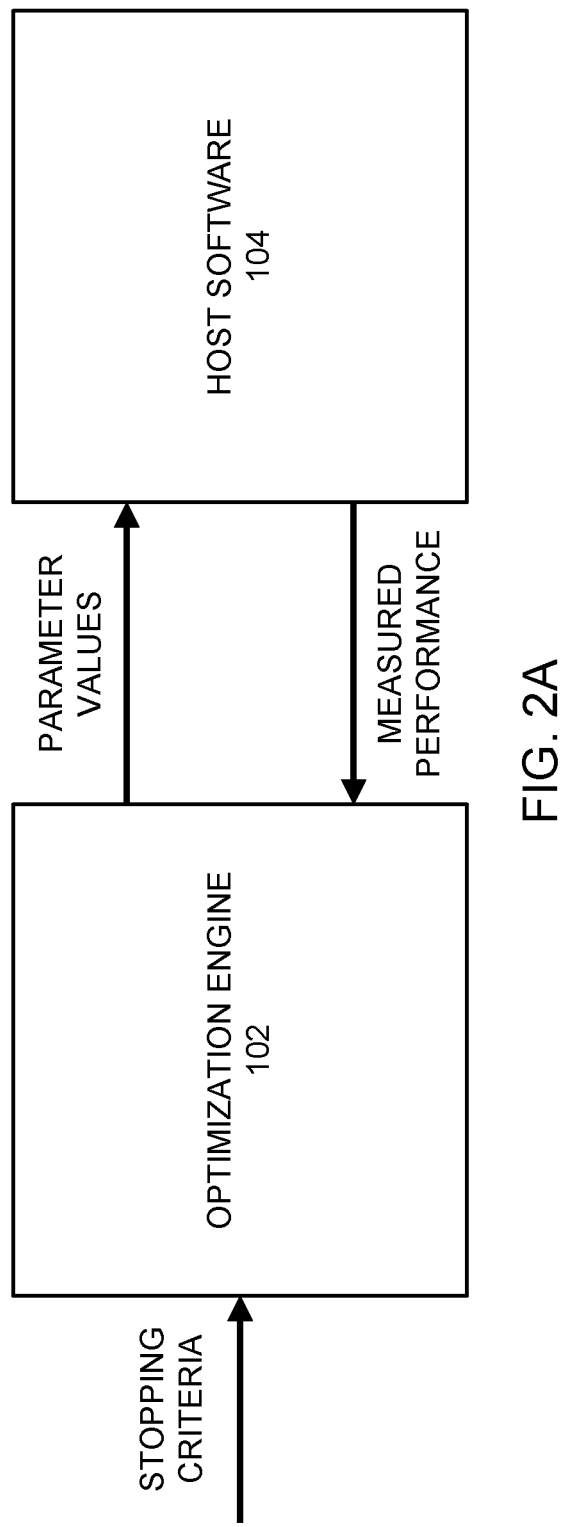

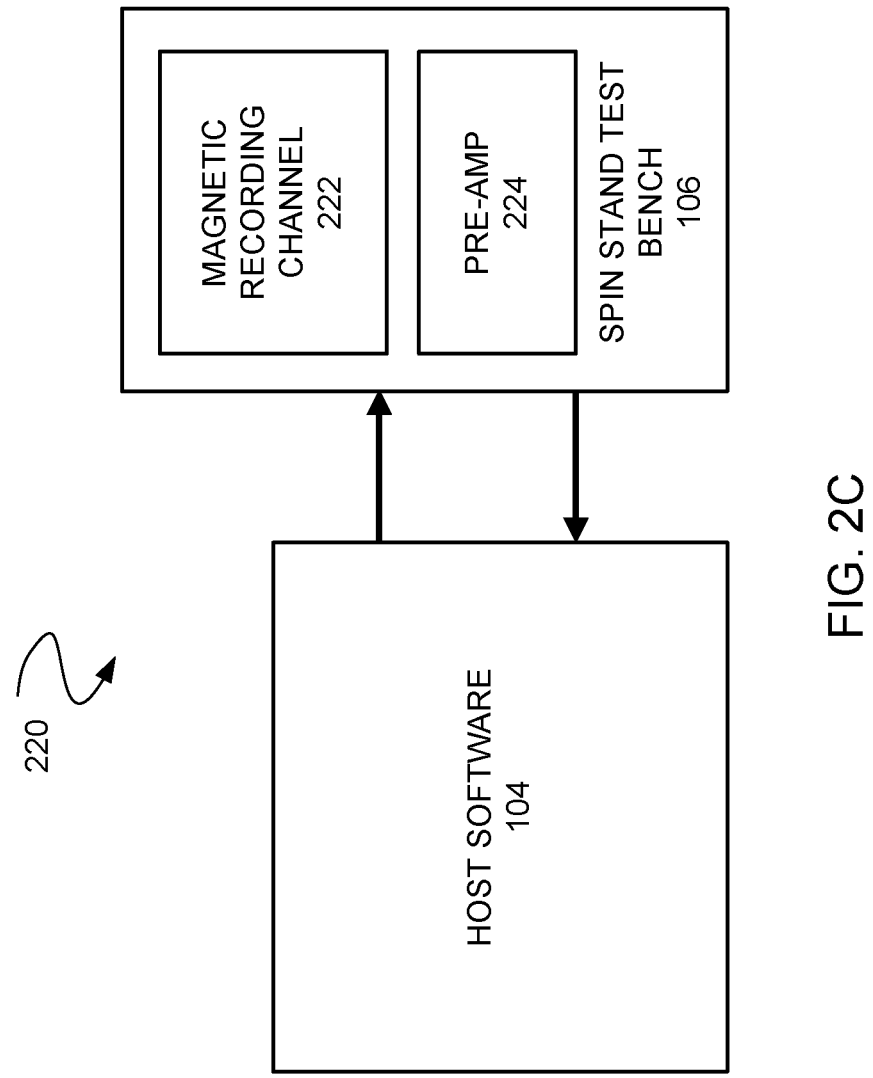

300

```
┌─────────────────────────────────────────────────────────┐
│ SELECTING PARAMETERS ASSOCIATED WITH A SECOND ALGORITHM │
│              USING A FIRST ALGORITHM                    │
│                         302                             │
└─────────────────────────────────────────────────────────┘
                              │
┌─────────────────────────────────────────────────────────┐
│ SELECTING INITIAL PARAMETERS ASSOCIATED WITH A MAGNETIC │
│ RECORDING CHANNEL USING THE SECOND ALGORITHM, WHEREIN   │
│ THE SECOND ALGORITHM IS CONFIGURED TO SIMULTANEOUSLY    │
│ OPTIMIZE A PLURALITY OF PARAMETERS ASSOCIATED WITH THE  │
│              MAGNETIC RECORDING CHANNEL                 │
│                         304                             │
└─────────────────────────────────────────────────────────┘
                              │
┌─────────────────────────────────────────────────────────┐
│ ITERATIVELY READING A TEST DATA, ITERATIVELY CALCULATING A │
│ PERFORMANCE ASSOCIATED WITH THE SELECTED PARAMETERS,    │
│ AND ITERATIVELY OPTIMIZING THE PLURALITY OF PARAMETERS  │
│          UNTIL A CERTAIN CONDITION IS SATISFIED         │
│                         306                             │
└─────────────────────────────────────────────────────────┘
                              │
┌─────────────────────────────────────────────────────────┐
│ RESPONSIVE TO THE CERTAIN CONDITION BEING MET, OPTIMIZING │
│ THE PARAMETERS ASSOCIATED WITH THE SECOND ALGORITHM     │
│ USING THE FIRST ALGORITHM. REPEATING ITERATIVELY READING A │
│ TEST DATA, ITERATIVELY CALCULATING A PERFORMANCE        │
│ ASSOCIATED WITH THE SELECTED PARAMETERS, AND ITERATIVELY │
│ OPTIMIZING THE PLURALITY OF PARAMETERS UNTIL A CERTAIN  │
│              CONDITION IS SATISFIED                     │
│                         308                             │
└─────────────────────────────────────────────────────────┘
                              │
┌─────────────────────────────────────────────────────────┐
│ RESPONSIVE TO THE CERTAIN CONDITION BEING MET, FURTHER  │
│ OPTIMIZING THE PARAMETERS ASSOCIATED WITH THE SECOND    │
│         ALGORITHM USING THE FIRST ALGORITHM             │
│                         310                             │
└─────────────────────────────────────────────────────────┘
```

FIG. 3

DATA CHANNEL OPTIMIZATION WITH SMART BLACK BOX ALGORITHMS

SUMMARY

The invention relates to a method and system for data channel optimization. A system includes a host configured to communicate with a device under test. The host is configured to write test data to the device under test. An optimization engine is configured to optimize a plurality of parameters associated with a magnetic recording channel associated with the device under test. The optimization engine is configured to select a first set of parameters for the plurality of parameters and the host is configured to set the magnetic recording channel based on the first set of parameters for the plurality of parameters. The host then measures the performance of the magnetic recording channel based on the first set of parameters. Based on the measured performance, the optimization engine then selects new parameter values for the plurality of parameters. Until the measured performance is within an acceptable threshold, the optimization engine will iteratively update the plurality of parameters based on the measured performance.

BRIEF DESCRIPTION OF DRAWINGS

FIG. 2A shows linkage between the optimization engine module and host software according to one aspect of the present embodiments.

FIG. 2C shows linkage between the host software and spin stand test bench according to one aspect of the present embodiments.

FIG. 3 flowchart illustrating preferred method for data channel optimization implementing a two-layer optimization scheme according to one aspect of the present embodiments.

DESCRIPTION

Figure 1:
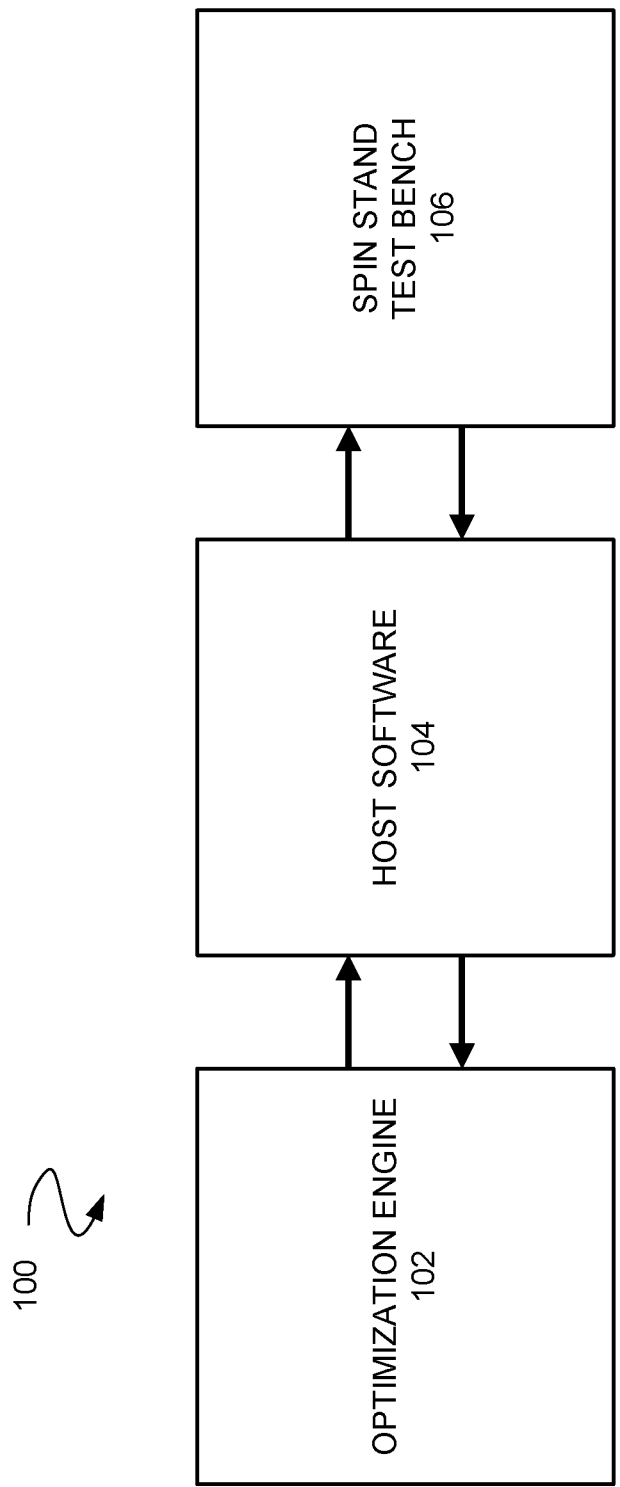
FIG. 1 shows a data channel optimization system according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

Magnetic recording channels, also known as data channels, are complex integrated circuits that enable efficient write and read of digital data on magnetic data storage media. To achieve performance efficiency, each component and sub-component of the magnetic recording channels circuits requires fine tuning of its associated parameters. Optimization strategies involve running individual and decoupled searches over each parameter. While local optimums of each parameter may be obtained, results obtained are not the joint optimum of the various parameters. Performance optimization of the magnetic recording channel as a whole thus becomes a challenge when parameters of each and every component involved are tuned separately.

A system and a method are disclosed for optimizing data channels through the use of smart black box algorithms. The present disclosure addresses the challenge and inefficiency of decoupled optimization by offering a holistic approach to parameter optimization. Specifically, an optimization algorithm is configured to optimize a plurality of parameters associated with the magnetic recording channel of a device under test through a host. The optimization algorithm first selects an initial algorithm and set of parameters for the selected algorithm upon which a plurality of parameters of the magnetic recording channel are initially set. The host is then configured to adjust the magnetic recording channel based on the initial set of parameters selected by the optimization algorithm. Performance of the magnetic recording based on that initial set of parameters is then measured by the host. Based on the observed performance obtained from the host, the optimization algorithm is then further configured to select new parameter values as input for the plurality of parameters of the magnetic recording channel. The process of input parameter generation, performance measurement, and parameter calibration is repeated iteratively until the measured performance is within an acceptable threshold. At that time, parameters of the selected algorithm may be changed and the process is repeated until the measure performance is within an acceptable threshold again. This process is repeated a number of times until a desired performance is achieved. As result, performance optimization is achieved through a holistic perspective instead of individual and decoupled optimization of each of magnetic recording channel's component parameters.

Referring now to FIG. 1, a data channel optimization system 100 including a core optimization engine 102, host software 104, and a spin stand test bench 106 is shown according to one aspect of the present embodiments. The core optimization engine 102 may be one or more algorithms that select initial and subsequent parameter values for the magnetic recording channel. In some embodiments, the initial parameter values are selected at random and optimized iteratively through performance feedback from the host software 104.

The host software 104 is configured to communicate with the optimization engine 102 and the spin stand test bench 106. Based on the initial parameter values generated by the optimization engine 102, the host software 104 reads the performance data from the spin stand test bench 106 and determines the parameter performance associated with the input parameter values. The measured performance is then transmitted to the optimization engine 102 and new parameter values are then adjusted accordingly.

The spin stand test bench 106 is configured to connect with the device under test, which contains the magnetic recording channel and various other associate hardware of the tested device. The components and sub-components of the magnetic recording channel respond to the parameter values generated by the optimization algorithm 102 and the corresponding performances are tracked inside the spin stand test bench 106. The process of input parameter value generation, performance measurement, and parameter value calibration is repeated iteratively until a certain condition is met. Conditions include but are not limited to bit error rate (BER), pre-determined number of testing iterations, etc. The BER measures the rate at which errors occur in a transmission system.

Referring now to FIG. 2A, linkage between the optimization engine 102 and host software 104 is shown according to one aspect of the present embodiments. The optimization engine 102 is configured to first select an initial set of parameter values for the plurality of parameters associated with magnetic recording channel of the spin stand test bench 106 (FIG. 1). In return, the host 104 then sets the magnetic recording channel based on the initial set of parameter values and measures the performance associated with the input parameter values. The performance measurements are then transmitted to the optimization engine 102 where the algorithm chooses a new set of optimized parameter values based on the information received. The newly generated values are then applied to the magnetic recording channel through the host software 104. Performance is again measured and fed into the optimization engine 102 to generate a new set of parameters values as input for the magnetic recording channel. The process of parameter value generation, performance measurement, and parameter value calibration repeats itself iteratively until a certain condition is satisfied.

Figure 2B:
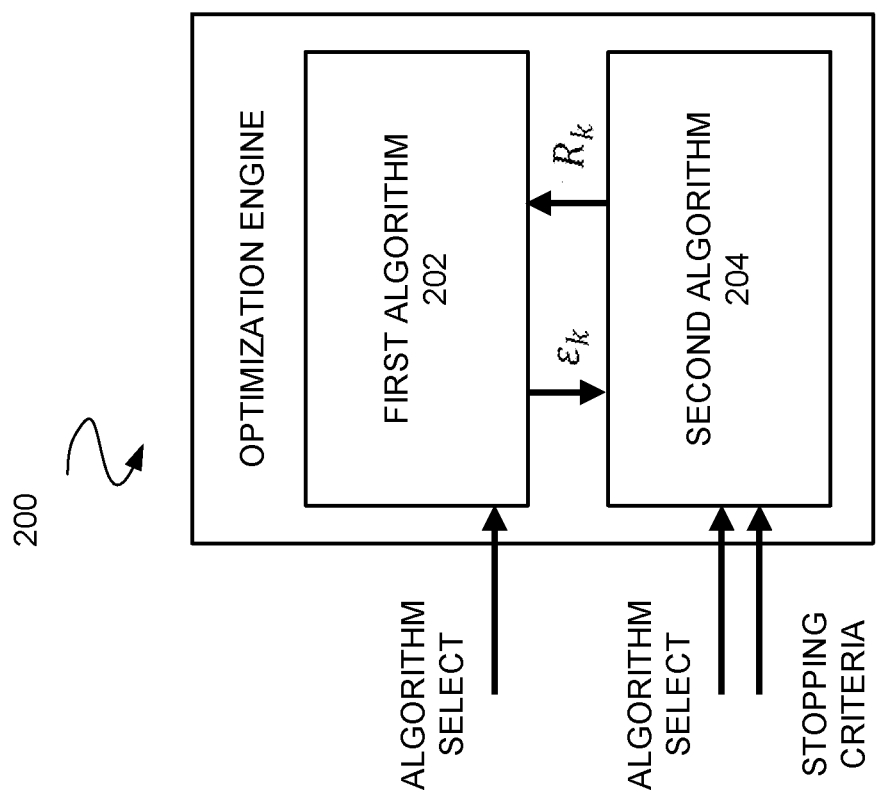
FIG. 2B shows a two-tier optimization algorithm according to one aspect of the present embodiments.

Referring now to FIG. 2B, an optimization engine 200 is shown according to one aspect of the present embodiments. Unlike optimization engine 102, optimization engine 200 utilizes a two tier approach in the optimization of plurality of parameters associated with a magnetic recording channel. The optimization engine 200 includes a first algorithm 202 and a second algorithm 204. The first algorithm 202 is tasked with the duty of investigating suitable parameter values, ε, for the second algorithm 204. The investigative parameter discovery process of the first algorithm 202, coupled with the optimization process of the second algorithm 204, is performed iteratively to narrow and discover the parameter optimums for the associated magnetic recording channel of the device under test. For each iteration step at the first algorithm 202, denoted by k, the parameter value $\varepsilon_k$ is selected and used as input to the second algorithm 204.

The second algorithm 204 is configured to optimize a plurality of parameters associated with the magnetic recording channel of the device under test. Within every iteration step k, the value of $\varepsilon_k$ is maintained at a constant level until the second algorithm 204 completes a optimization cycle associated with the iteration step. The convergence of a optimization cycle of the second algorithm 204 comes to a stop when the parameters are optimized and yields the reward, $R_k$, to the corresponding $\varepsilon_k$. $R_k$ represents the optimized parameters from the various components and sub-components of the magnetic recording channel based on the parameter input $\varepsilon_k$. $R_k$ is then transmitted to the first algorithm 202 and the parameter values for the second algorithm 204 are adjusted according to the $R_k$ received. As the first algorithm 202 iteration progresses, better $\varepsilon_k$ values are selected for which the reward $R_k$ is gradually optimized.

In some embodiments, the first algorithm 202 and the second algorithm 204 are selectable by the user. The first algorithm 202 can be selected to be a type of Bandit algorithm, for example, the upper confidence bound (UCB) algorithm. In some embodiments of the second algorithm 204, the second algorithm 204 is selected from a group of algorithms consisting of the Truncated Newton (TN) method, Sequential Least Squares Programming (SLSP) and Limited Memory version of Broyden-Fletcher-Goldfarb-Shanno (L-BFGS-B) algorithm. It is understood that other prevalent optimization algorithms can be utilized in place of SLSP and L-BFGS-B. In other embodiments, the first algorithm 202 and the second algorithm 204 are machine learning based algorithms. The machine learning based algorithms investigate suitable parameters without explicit selections or instructions from the user and iteratively find parameter values that can be utilized for efficient optimization.

Referring now to FIG. 2C, linkage between the host software 104 and the spin stand test bench 106 is shown according to one aspect of the present embodiments. The spin stand test bench 106 is configured to connect with the device under test, which contains the magnetic recording channel 222. The host software 104 sets the magnetic recording channel 222 based on the parameter values received and measures the parameter performance of the components and sub-components of the magnetic recording channel 222. An example of measured performance is bit error rate (BER). The spin stand test bench may include an associated hardware, pre-amplifier 224. The spin stand test bench 106 allows for interactions with the pre-amplifier 224 to track parameter performances of write current, write current overshoot duration, and write current overshoot amplitude.

Figure 2D:
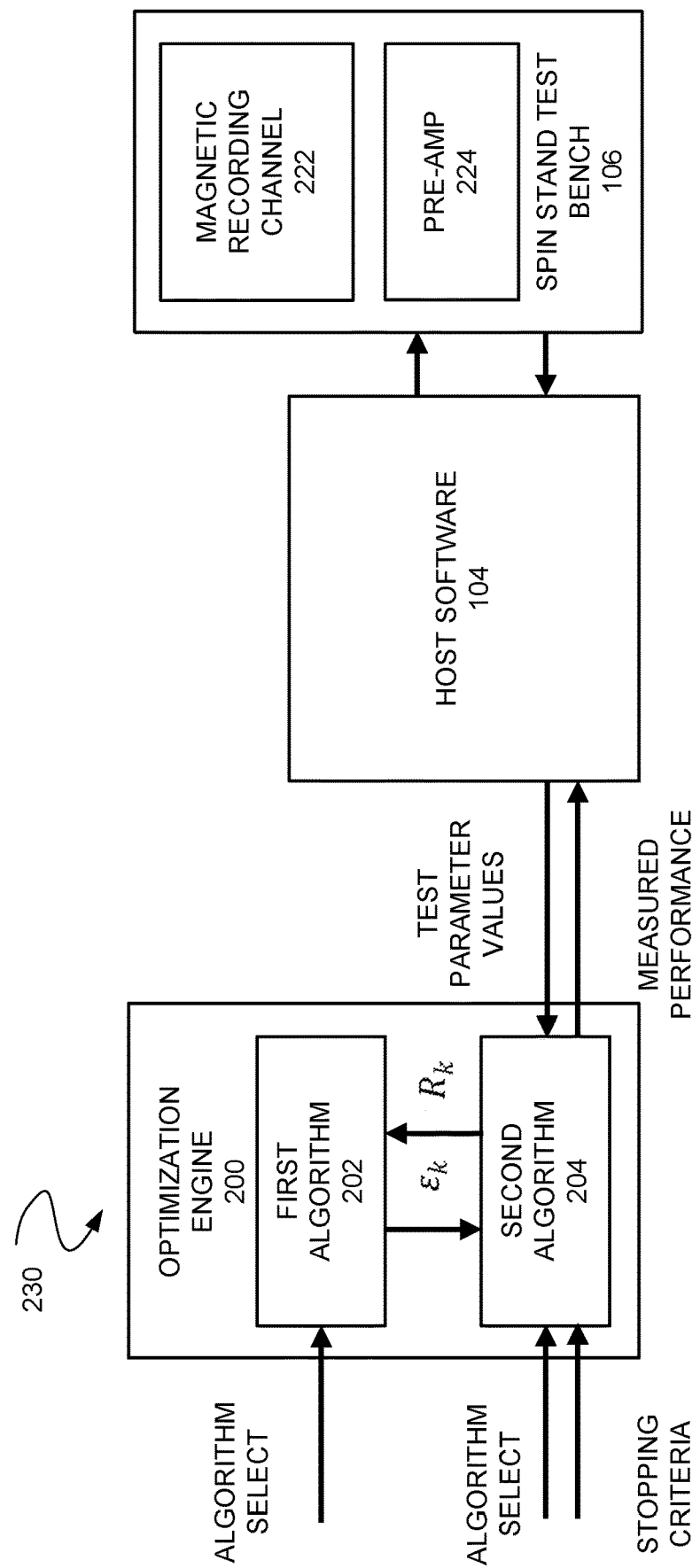
FIG. 2D shows a data channel optimization system utilizing a two-tier optimization engine according to one aspect of the present embodiments.

Referring now to FIG. 2D, a data channel optimization system 230 including a core optimization engine 200, a host software 104, and a spin stand test bench 106 is shown according to one aspect of the present embodiments. The two-tier core optimization engine 200 utilizes the first algorithm 202 for selecting suitable parameter values, ε, for the second algorithm 204. The second algorithm 204 is configured to optimize a plurality of parameters associated with the magnetic recording channel 222 of the device under test, where test parameter values are generated for the host software 104 and test parameter values are optimized locally. The investigative parameter discovery process of the first algorithm 202, coupled with the optimization process of the second algorithm 204, are performed iteratively to tune and discover the parameter optimums for the associated magnetic recording channel of the device under test. Within every iteration step k, the input parameter value $ε_k$ is maintained at a constant level until the second algorithm 204 completes a full optimization cycle of the plurality of parameters associated with the iteration step.

The test parameter values as generated by the second algorithm 204 are then sent to the host software 104, which sets the magnetic recording channel of the device under test based on the test parameter values received. When the magnetic recording channel 222 is set based on the test parameter values generated at the second algorithm 204, the components and sub-components of the magnetic recording channel respond to the test parameter values accordingly. The host software 104 then reads the data from the spin stand test bench 106 and measures the performance associated with the test parameter values. The spin stand test bench 106 is configured to connect with the device under test, which contains the magnetic recording channel 222 and various other associate hardware of the tested device. The second algorithm 204 in turn receives the measured performance of the components and sub-components of the magnetic recording channel and optimizes the test parameter values accordingly.

The optimization cycle of the second algorithm comes to a stop when the test parameter values of the second algorithm 204 converge and the performance of the components and sub-components of the magnetic recording channel are optimized based on the test parameter values. As result of which, the reward, $R_k$, that corresponds to the particular $ε_k$ is generated. $R_k$ represents the optimized parameters from the various components and sub-components of the magnetic recording channel based on the parameter input $ε_k$. $R_k$ is then transmitted to the first algorithm 202 from the second algorithm 204 and the parameter values for the second algorithm 204 are adjusted according to the $R_k$ received. As the first algorithm 202 iteration progresses, better $ε_k$ values are selected for which the reward $R_k$ is gradually optimized. The process of input parameter value generation, performance measurement, and parameter value calibration is repeated iteratively until a certain condition is met. As result of the iterative fine-tuning process, parameter values are optimized for the various components and sub-components associated with the magnetic recording channel.

Figure 2E:
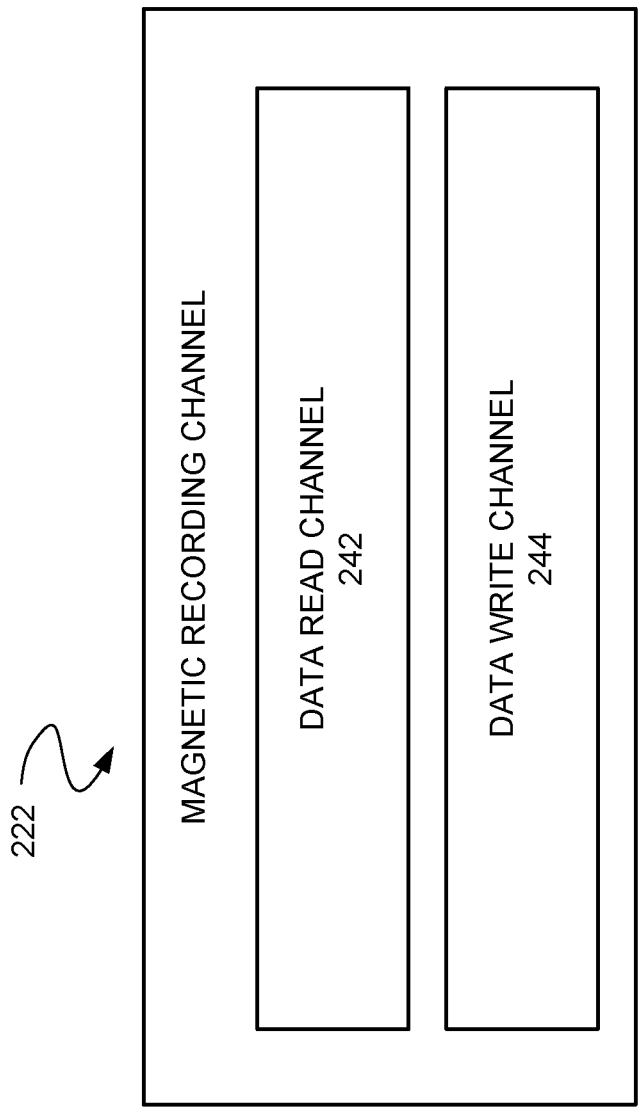
FIG. 2E shows a magnetic recording channel according to one aspect of the present embodiments.

Referring now to FIG. 2E, the magnetic recording channel 222 is shown according to one aspect of the present embodiments. As complex integrated circuits, magnetic recording channels are comprised of multiple components and sub-components. In some embodiments, the magnetic recording channel 222 includes a write data channel 244 to write data tracks and a read data channel 242 to detect the written data from media. Components write data channel 244 and read data channel 242 are composed of multiple sub-components. Accordingly, the optimization process as described above can be used to optimize the write data channel 244 and/or the read data channel 242.

Figure 2F:
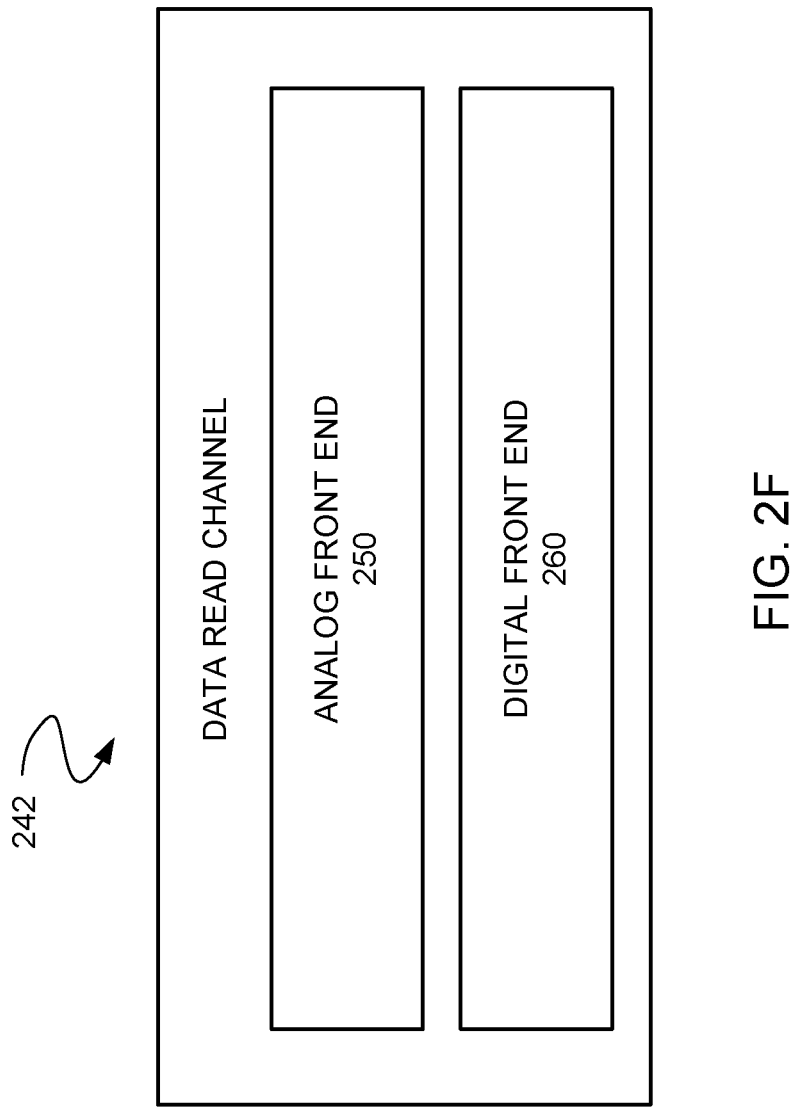
FIG. 2F shows a data read channel according to one aspect of the present embodiments.

Referring now to FIG. 2F, the data read channel 242 is shown according to one aspect of the present embodiments.

In some embodiments, the data read channel 242 comprises an analog front end 250 and a digital front end 260. It is appreciated that the parameters associated with analog front end 250 and/or the digital front end 260 are optimized as described above. Parameter performance of the analog front end 250 and the digital front end are tracked at the spin stand test bench 106 (FIG. 2C and FIG. 2D) and transmitted to the host software 104 (FIG. 2C and FIG. 2D). The tracked performance is then measured by the host software 104 and transmitted to the optimization engine for further adjustment of parameter values.

Figure 2G:
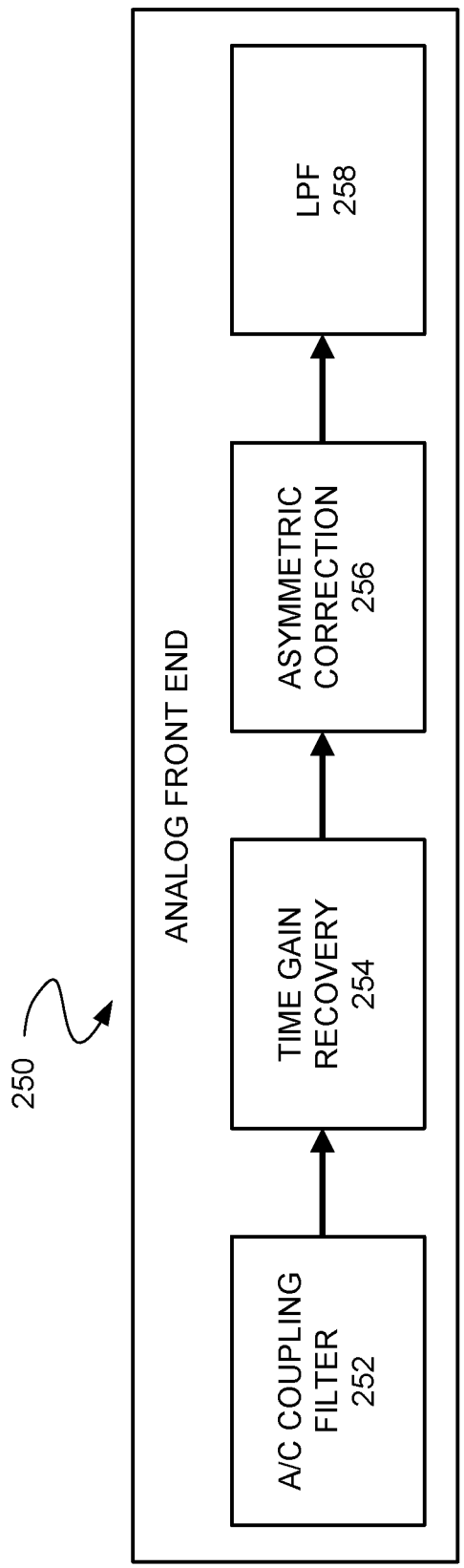
FIG. 2G shows an analog front end according to one aspect of the present embodiments.

Referring now to FIG. 2G, the analog front end 250 is shown according to one aspect of the present embodiments. Each component in the data channel circuit includes its own sub-components. In some embodiments, the analog front end 250 comprises an A/C coupling filter 252, a time gain recovery unit 254, an asymmetric correction 256, and a low pass filter 258. It is appreciated that the parameters associated with A/C coupling filter 252, the time gain recovery unit 254, the asymmetric correction 256, and/or the low pass filter 258 are optimized as described above. To achieve performance efficiency, each sub-component requires careful tuning of associated parameters. Optimization of such parameters is achieved through the holistic parameter optimization of the present disclosure. The performance of the sub-components is tracked inside the spin stand test bench 106 (FIG. 2C and FIG. 2D) and measured by the host software 104 (FIG. 2 C and FIG. 2D). The tracked performance is then measured by the host software 104 and transmitted to the optimization engine for further adjustment of parameter values.

Figure 2H:
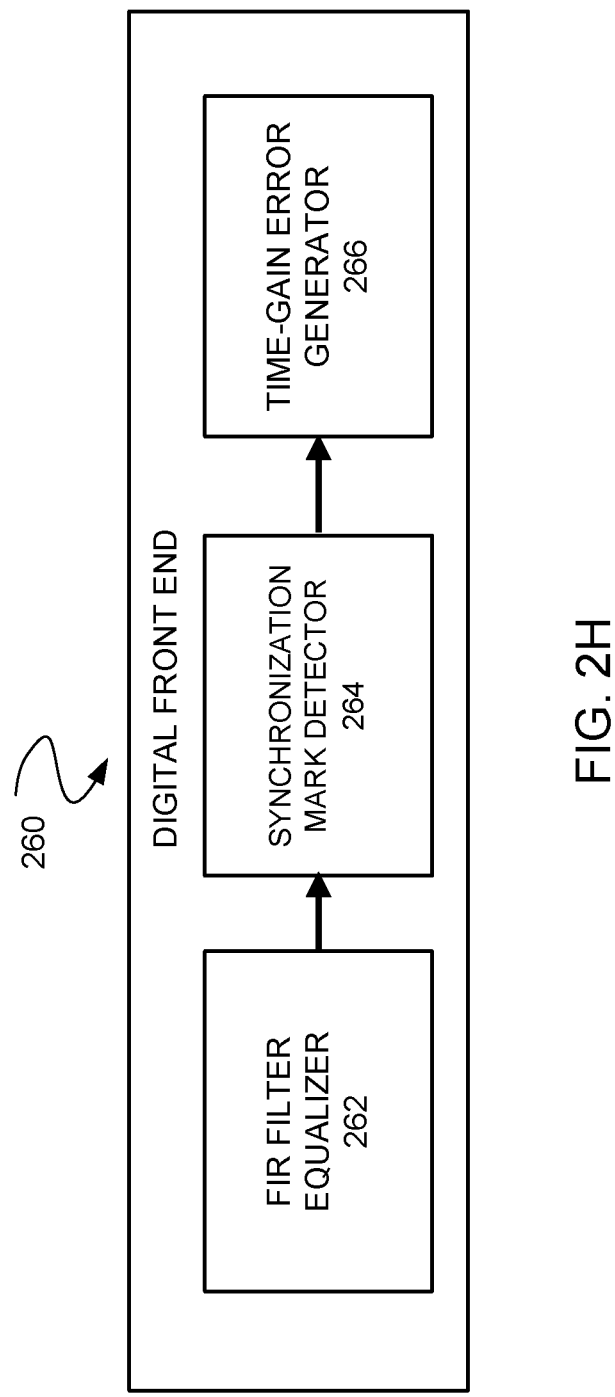
FIG. 2H shows a digital front end according to one aspect of the present embodiments.

Referring now to FIG. 2H, the digital front end 260 is shown according to one aspect of the present embodiments. Each component in the data channel circuit includes its own sub-components. In some embodiments, the digital front end 260 comprises a FIR filter equalizer 262, a synchronization mark detector 264, and a time-gain error generator 266. Optimization of aforementioned parameters is achieved through the holistic parameter optimization of the optimization engine. The parameter performance of the sub-components is tracked inside the spin stand test bench 106 (FIG. 2C and FIG. 2D) and measured by the host software 104 (FIG. 2C and FIG. 2D), where the measured performance is received at the optimization engine where parameter values are iteratively adjusted based on the tracked performance.

Referring now to FIG. 3, a flowchart illustrating preferred method 300 for data channel optimization implementing a two-layer optimization scheme is shown according to one aspect of the present embodiments. The flowchart starts at block 302, where a first algorithm is used in selecting parameters associated with a second algorithm. The flowchart continues to block 304, where initial parameters associated with a magnetic recording channel are selected using a second algorithm, wherein the second algorithm is configured to simultaneously optimize a plurality of parameters associated with the magnetic recording channel. The flowchart then continues to block 306, where test data reading, performance calculation associated with the selected parameters, and optimization of the plurality of parameters continue iteratively until a certain condition is satisfied. Responsive to the certain condition being met, parameters associated with the second algorithm will be optimized using the first algorithm and test data reading, performance calculation associated with the selected parameters, as well as optimization of the plurality of parameters continue iteratively until a certain condition is satisfied, as shown in block 308. The flowchart then continues to block 310, where further optimization of parameters associated with the second algorithm is achieved through the first algorithm. The continuous iterations will come to a stop when the stopping condition is met. In some embodiments, the method 300 further comprises writing test data where the parameter values and number of iteration steps at the completion of optimizer runs are recorded for the purpose of performance comparison among different algorithms.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. The scope of the proposed algorithm may be applied to address a wider variety of disc drive optimization problems where a joint search of parameters is necessary. Accordingly, departures may be made from the foregoing embodiments and/or examples without departing from the scope of the concepts described herein. The implementations described above, and other implementations are within the scope of the following claims.

What is claimed is:

1. A method comprising:
   selecting parameters associated with a second algorithm using a first algorithm;
   selecting an initial set of parameters for a plurality of parameters associated with a magnetic recording channel using the second algorithm, wherein the second algorithm is configured to simultaneously optimize the plurality of parameters associated with the magnetic recording channel, the simultaneous optimization being part of an iterative process comprising:
   (a) performing a write operation to write test data, the write operation being performed with the magnetic recording channel having the plurality of parameters;
   (b) performing a read operation that comprises reading the test data, the read operation being performed with the magnetic recording channel having the plurality of parameters;
   (c) calculating a performance of the magnetic recording channel for the read operation, an updating the plurality parameters if the calculated performance does not meet a certain condition,
   wherein (a), (b) and (c) are repeated until the certain condition is met;
   responsive to the certain condition being met, optimizing the parameters associated with the second algorithm using the first algorithm;
   responsive to the optimizing the parameters associated with the second algorithm using the first algorithm, repeating (a), (b) and (c) until the certain condition is met; and
   responsive to the certain condition being met, further optimizing the parameters associated with the second algorithm using the first algorithm.

2. The method of claim 1, wherein the selecting the parameters associated with the second algorithm and wherein the selecting the initial set of parameters associated with the magnetic recording channel is random.

3. The method of claim 1, wherein the first algorithm is an upper confidence bound (UCB) algorithm.

4. The method of claim 1, wherein the second algorithm is selected from a group consisting of the Truncated Newton (TN) method, Sequential Least Squares Programming (SLSP) and Limited Memory version of Broyden-Fletcher-Goldfarb-Shanno (L-BFGS-B) algorithm.

5. The method of claim 1, wherein the performance is measured by bit error rate (BER).

6. The method of claim 1, wherein the certain condition is a bit error rate (BER) being less than a predetermined threshold.

7. The method of claim 1, wherein the magnetic recording channel comprises an analog front end and a digital front end.

8. The method of claim 7, wherein the analog front end comprises A/C coupling filter, a time gain recovery unit, an asymmetric correction, and a low pass filter.

9. The method of claim 7, wherein the digital front end comprises a FIR filter equalizer, a synchronization mark detector, and a time-gain error generator.

10. A system comprising:
    a host configured to communicate with a device under test, wherein the host is further configured to write test data to the device under test; and
    an optimization engine configured to simultaneously optimize a plurality of parameters associated with a magnetic recording channel associated with the device under test,
    wherein the optimization engine is configured select a first set of parameters for the plurality of parameters, and wherein the host is configured to set the magnetic recording channel based on the first set of parameters for the plurality of parameters,
    wherein the host is configured to measure performance of the magnetic recording channel based on the first set of parameters, and
    wherein the optimization engine is further configured to determine whether the measured performance with the magnetic recording channel set based on the first set of parameters is within a predetermined acceptable threshold,
    and wherein, for a condition where the optimization engine determines that the measured performance with the magnetic recording channel set based on the first set of parameters is not within the predetermined acceptable threshold;
    (a) the optimization engine is further configured to update the plurality of parameters,
    (b) the host is configured to set the magnetic recording channel based on the updated plurality of parameters and configured to the measure performance of the magnetic recording channel based on the updated plurality of parameters, and
    (c) the optimization engine is further configured to determine whether the measured performance with the magnetic recording channel set based on the updated plurality of parameter is within the predetermined acceptable threshold, and
    wherein the optimization engine and the host are configured to perform (a), (b) and (c) iteratively until the measured performance is within the predetermined acceptable threshold.

11. The system of claim 10, wherein the optimization engine comprises a first algorithm and a second algorithm, wherein parameters of the second algorithm are selected using the first algorithm and wherein the parameters of the second algorithm are optimized iteratively, and wherein the second algorithm is configured to simultaneously optimize the plurality of parameters associated with the magnetic recording channel.

12. The system of claim 11, wherein the first algorithm is an upper confidence bound (UCB) algorithm.

13. The system of claim 11, wherein the second algorithm is selected from a group consisting of the Truncated Newton (TN) method, Sequential Least Squares Programming (SLSP) and Limited Memory version of Broyden-Fletcher-Goldfarb-Shanno (L-BFGS-B) algorithm.

14. The system of claim 10, wherein the performance is measured by bit error rate (BER).

15. The system of claim 10, wherein the magnetic recording channel comprises an analog front end and a digital front end.

16. The system of claim 15, wherein the analog front end comprises A/C coupling filter, a time gain recovery unit, an asymmetric correction, and a low pass filter.

17. The system of claim 15, wherein the digital front end comprises a FIR filter equalizer, a synchronization mark detector, and a time-gain error generator.

18. A system comprising:
a host configured to communicate with a device under test, wherein the host is further configured to write test data to the device under test; and
an optimization engine comprising a first algorithm and a second algorithm, wherein the first algorithm is configured to perform first optimization operations in which parameters associated with the second algorithm are optimized, and wherein the second algorithm is configured to perform second optimization operations in which a plurality of parameters associated with a magnetic recording channel associated with the device under test are simultaneously optimized, and
wherein the first optimization operations and the second optimization operations are configured to be performed iteratively and responsive to performance measurements.

19. The system of claim 18, wherein the first algorithm and the second algorithm are machine learning based algorithms.

* * * * *

UNITED STATES PATENT AND TRADEMARK OFFICE
CERTIFICATE OF CORRECTION

PATENT NO. : 10,935,603 B1
APPLICATION NO. : 16/534753
DATED : March 2, 2021
INVENTOR(S) : Sayan Ghosal et al.

It is certified that error appears in the above-identified patent and that said Letters Patent is hereby corrected as shown below:

In the Claims

Column 7, Claim 1, Line 45, please insert the word --of-- between the words "plurality" and "parameters".

Column 8, Claim 10, Line 54, please replace the word "parameter" with the word --parameters--.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*